United States Patent
Bhavsar (12)

(10) Patent No.: US 6,286,116 B1
(45) Date of Patent: Sep. 4, 2001

(54) BUILT-IN TEST METHOD FOR CONTENT ADDRESSABLE MEMORIES

(75) Inventor: Dilip K. Bhavsar, Shrewsbury, MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/277,008

(22) Filed: Mar. 26, 1999

(51) Int. Cl.[7] ............... G11C 29/00; G01R 31/28; G06F 11/00; G06F 7/02; H03M 13/00

(52) U.S. Cl. ............... 714/720; 714/733; 714/735; 714/742

(58) Field of Search .................. 714/720, 718, 714/719, 733, 738

(56) References Cited

U.S. PATENT DOCUMENTS

| | | | |
|---|---|---|---|
| 4,680,760 | * | 7/1987 | Giles et al. ............... 714/718 |
| 4,730,322 | * | 3/1988 | Pollara-Bozzola ............... 714/792 |
| 5,107,501 | * | 4/1992 | Zorian ............... 714/720 |
| 5,293,383 | * | 3/1994 | Knefel ............... 714/703 |
| 5,325,367 | * | 6/1994 | Dekker et al. ............... 714/718 |
| 5,381,419 | * | 1/1995 | Zorian ............... 714/720 |
| 5,491,703 | * | 2/1996 | Barnaby et al. ............... 714/766 |
| 5,535,164 | * | 7/1996 | Adams et al. ............... 365/201 |
| 5,563,833 | * | 10/1996 | Adams et al. ............... 365/201 |
| 5,740,098 | * | 4/1998 | Adams et al. ............... 365/49 |
| 5,796,758 | * | 8/1998 | Levitan ............... 714/800 |
| 5,802,070 | * | 9/1998 | Adams et al. ............... 714/718 |
| 5,848,074 | * | 12/1998 | Maeno ............... 714/720 |
| 6,229,742 | * | 5/2001 | Srinivasan et al. ............... 365/200 |

* cited by examiner

*Primary Examiner*—Albert DeCady
*Assistant Examiner*—Joseph D. Torres
(74) *Attorney, Agent, or Firm*—Hamilton, Brook, Smith & Reynolds, P.C.

(57) ABSTRACT

A method and apparatus for built in self test, BIST, of content addressable memory, CAM, and associated random access memory, RAM, is described. The method and apparatus may most beneficially be used for difficult to test situations such as embedded CAM or other memory types. There are no external memory read operations to determine the contents of a memory location, so little additional circuitry or overhead, such as separate read ports, is required on the embedded memory for implementation of the BIST. Only a number generator, a shift register and an OR gate with inputs from each of the CAM word match lines are added to the circuit in which the memory is embedded. The test uses a set of unique data patterns, each one spaced from the others by two bit locations, a walking inversion test, and a complement and reverse pattern test to determine what type of error and the error location. With such a system the testing of embedded CAM or other memory types such as RAM and FIFO is simplified, and the test fault coverage is improved.

20 Claims, 4 Drawing Sheets

BUILT-IN TEST METHOD FOR CONTENT ADDRESSABLE MEMORIES

BACKGROUND OF THE INVENTION

Content addressable memory, known as CAM, are memory structures used to store similar pieces of data, or to store data that are frequently used in certain parts of computer programs. These data are stored in the CAM either with no particular order, or in the order in which they were previously used by the computer program. When an operating computer program reaches a step where a particular piece of data is needed, the program first asks if the required data is present in the CAM. The data in the CAM is sorted through, a process known as a sieve, and if data match is found, then the program does not have to take the time to go to the main memory to fetch the data. This results in a large time savings, and thus faster program operation.

Typically it is not the data itself that is sieved and matched, but a shorter summarization of the data, known as a tag. It is easier to sieve and match the short tags and thus the size of the content addressable memory can be reduced. The tag is associated with a specific element in a cache memory that holds the data. Thus CAM memories are useful in computers, and numerous CAM memories are found in most typical modern microprocessors and computer systems.

An example of the use of a CAM is found in memory testing. In the testing of a random access memory (RAM) device, several different types of tests will be done, and it may be interesting to know how many different locations on the RAM are defective. It would confuse the data to have the same RAM location, for example column 3 and row 4, listed as defective two or three different times. Thus the testing sequence might be to exercise the RAM with what is known as a rippling ones test, and find that location 3, 4 fails. This is stored in the CAM. The next test might be a rippling zeros test which also finds location 3,4 defective. The CAM is examined and the location 3,4 is found by matching and thus the rippling zeros test is not recorded as a new failure. Next, there may be a checkerboard test done which finds location 3,4 and location 15,1 failing. Matching both locations against the CAM will result in finding location 3,4 already in the memory and location 15,1 a new failure location, which is then recorded. Thus two distinct locations are found and recorded as failures from the three tests, versus the four failures which would have resulted from the two bad locations over the three tests.

It is well known how to test memories for proper functionality. Typical memory types such as random access memory (RAM) may be tested by writing a logic high, or a one into each memory location in turn, and reading that memory location value to check if a one is written there. The same thing is done by writing a logical low or zero. These two tests determine if any particular bit of the RAM is stuck either high or low. Frequently a checkerboard of alternating ones and zeros is written and read to test the memory. The checkerboard pattern is particularly useful for finding single RAM bit elements that have leakage paths to adjacent RAM elements, something which is not truly tested by the ones or zeros tests where the voltage level may remain high because the adjacent cell to which a leak exists is also high. There also exist tests which write a one into a memory of all zeros, and 'walks' the one value through the memory. The comparable walking zero test is also well known in the art.

While the described testing process may be sufficient to completely test RAMs, it is not sufficient for completely testing CAMs, because a CAM is accessed by means of a compare of each of a number of individual bits that make up the tag that is stored in the CAM. Thus a CAM test must test not only that what is written into the CAM, i.e., the stuck-at tests described above, but also that the compare bits work as well. Some CAMs also have a wild card feature which allows matching to selected parts of the entire word. As a result of these features, it is more difficult in general to test CAMs than other types of devices.

It is also much more difficult to test a memory that is built into a logic or microprocessor device. This is known as an embedded memory. This is because in the embedded memory case, not all of the inputs to the memory are accessible to the tester. In general, none of the memory inputs are accessible since only the microprocessor ever needs to write or read from the embedded memory, and input pads are almost always in short supply due to the large increase in device size required for additional input pads. Thus, it is known to be difficult to design tests for embedded memories which will sufficiently test the memory function by exercising the microprocessor alone.

It is known in the art to add some circuitry to the embedded memory to allow what is known as a built-in self test, or BIST. The addition of BIST does add some increased area to the silicon device, but much less than the addition of input and output pads, and it also results in reduced testing difficulty and improved testing fault coverage. BIST is becoming very common in the art for testing various memory types such as RAM, ROM and FIFO, but BIST for CAMs present more difficult problems than for the other memory types, because CAMs have different operating modes than other memory types. Specifically, CAMs have to be tested for the ability to compare or match a test data value with different data values and find the correct data value stored in the CAM. For additional information on BIST for CAMs, see U.S. Pat. No. 5,107,501 by Yervant Zorian, issued Apr. 21, 1992. However, prior art BIST for CAMs requires that the CAM have an additional read port, bus and circuitry added to each cell of the CAM, which adds area to the silicon device. Additionally, the BIST testing of CAMs has controllability and observability problems even with the additional circuitry, read ports and buses, because the propagation logic needed to transport the CAM output to an observability point such as an output pad is long and complex.

Therefore, it would solve a problem in the art to provide a built-in self test mechanism that is simple, adds less cost to the silicon device, and provides better precision in verifying the location of the CAM defect.

SUMMARY OF THE INVENTION

A method and apparatus for built in self testing (BIST) of content addressable memories (CAMs) is disclosed, comprising the steps of creating a set of unique binary data patterns, with the number of unique patterns being at least as large as the number of words contained in the CAM. The method works best when the number of words in the CAM is less than the number of bits in each word, and where the patterns each differ from the other patterns at two or more bit locations. A different one of the unique patterns is written into each of the word locations contained in the CAM, and then each one of the unique patterns is compared individually with each CAM entry. An OR gate is used to determine whether each one of the compared unique patterns matches the contents of one of the words contained in the content addressable memory, and to indicate an error or memory fault if any one of the compared patterns did not indicate a match with any of the stored patterns. This provides CAM failure information without requiring that the CAM data be externally read, and thus does not require that the CAM have a read port. The unique patterns are inverted one bit at a time, and compared to the stored patterns after each bit inversion. There should be no matches found. This testing helps determine cause and location of the fault, without requiring any read operations.

The testing is repeated using the logical complement of each unique pattern, and repeated again using the reverse of each unique pattern. With the described set of tests the location and type of memory fault may be determined without ever having to read the contents of the content addressable memory. Without the requirement of memory reading, there is no need to add read ports to CAMs that are frequently embedded in microprocessors and other semiconductor logic and memory devices.

In other embodiments of the invention, random access memories, particularly embedded RAMs, may be BIST tested using the CAM as the self test engine, and the common case of an embedded CAM having an associated RAM is BIST tested by repeating the CAM compare twice in a row, once while writing to the associated RAM word, and again after reading the RAM word back into the CAM.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
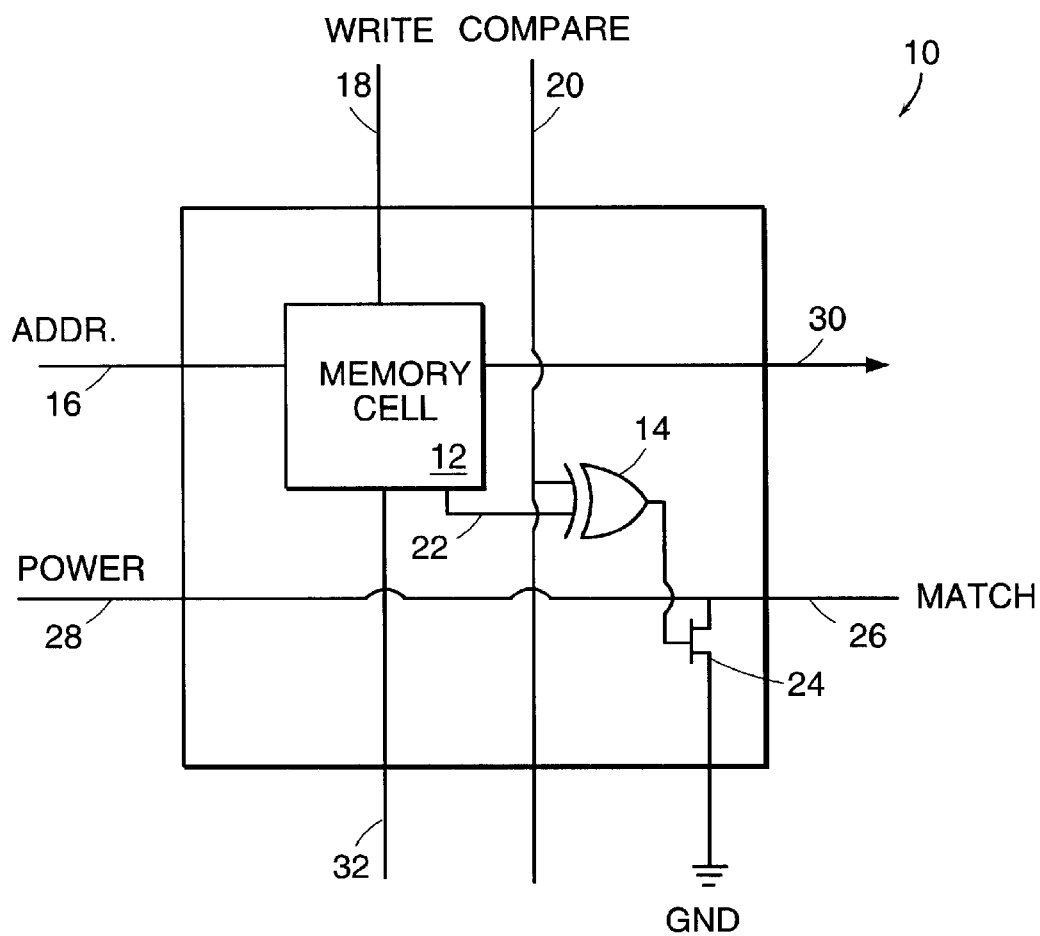
FIG. 1 is a schematic of a content addressable memory cell.

FIG. 1 shows a single bit content addressable memory CAM cell 10, having a single bit memory cell 12 and a comparator 14, in this illustrative embodiment an exclusive OR gate (XOR). A typical CAM consists of an array of such single bit CAM cells 10. The memory cell 12 is the storage element in the CAM cell 10, and may be any well known form of memory cell. The CAM is written when the addressing wordline 16 is asserted and the write line 18 from a logic element (not shown), such as a microprocessor or arithmetic logic unit (ALU), writes the desired logic value into memory cell 12. The CAM is read or compared for the value of the logic stored in cell 12 when the compare line 20 is asserted. Assuming for the purposes of example that the data stored in cell 12 is a logic one, then if compare line 20 is not asserted, or if there is a logic zero on compare line 20, then the assumed logic one in cell 12 causes output line 22 to be high and the XOR gate 14 has a one on only one of the two inputs, and the output of XOR 14 to pull down transistor 24 is a one. A logic one causes pull down transistor 24 to turn on and pull match line 26 to ground, or a logic zero. Match line 26 is usually what is known as precharged, typically by connection to a power line 28 through a transistor or resistor current limiter (not shown). Thus the match line 26 is pulled down to ground, or a logic zero, whenever there is not a match between output line 22 and compare line 20.

If the value of the memory cell 12 on output line 22 is a logic one and the value of the compare line 20 is also a logic one, then a match has occurred, the XOR 14 output will be zero, and the pull down transistor 24 will be turned off, causing match output line 26 to rise to a logic one, indicating that a match has been found. Note that the continuation 30 of address line 16 through the memory cell 12 goes to the next CAM bit cell in the memory word, and the continuation 32 of the write line 18 goes to the next CAM word in the array of memory cells that make up the CAM.

Figure 2:
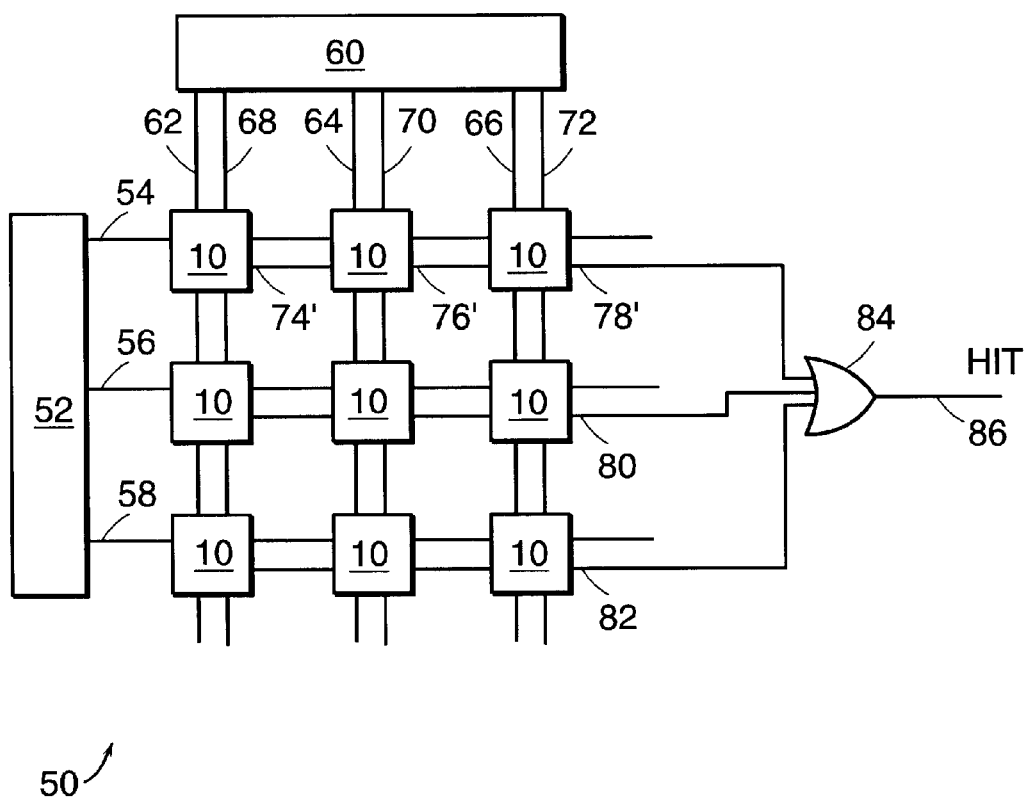
FIG. 2 is a schematic showing an array of content addressable memory cells.

Referring now to FIG. 2, an exemplary CAM 50 consists of a three by three array of single bit CAM cells 10. In general, a CAM will have a number "n" of bits in each word, and will have a number "m" of different words, thus creating what is known as an "m by n" array. Address logic 52 determines the particular word asserted, with the three bit data word stored in the three cells 10 on line 54, normally called the zero line, and continuing with the data word on line 56 and the word on line 58. The three bit data in the three words is written from logic 60 on the three write lines 62, 64 and 66, and the compare data bits are on lines 68, 70 and 72. Each cell 10 in one of the word lines 54, 56 and 58 have their match data lines 74, 76 and 78 connected with an AND gate so that the output on lines 78, 80 and 82 indicate if all three bits are a match, i.e., the compare word exactly matches the stored word. If any one to the three match lines is high, then OR gate 84 is high and a hit is said to have occurred on output line 86. The addition of OR gate 84 provides the present invention with a group hit line and permits the present invention to preform a unique set of CAM tests.

In normal operation of a defect free CAM, each of the word on lines 54, 56 and 58 will have different data, and thus the match lines 78, 80 and 82 will be mutually exclusive and only one, or possibly none, of the match lines will be asserted. When hit line 86 is high, there has been one match found in the CAM array 50.

A defect in a CAM array may be similar to the previously discussed defects found in other memory types, such as a cell stuck at zero or one, addressing logic faults, precharge transistors stuck on or off, or adjacent cells have a leakage path causing the values to become the same along a word or from word to word in the same bit location. CAMs may also have additional defects including having the comparator 14 stuck at zero or one, or the pull down transistor 24 on a word line stuck at either on or off. The present invention uses the grouped match output OR gate 84 and a series of unique data patterns in which all of the patterns differ from each other by at least two bit locations to detect any CAM failure without having to add a read port to examine the contents of the CAM cells. The testing uses the already existing match to indicate when a failure is present.

Figure 3:
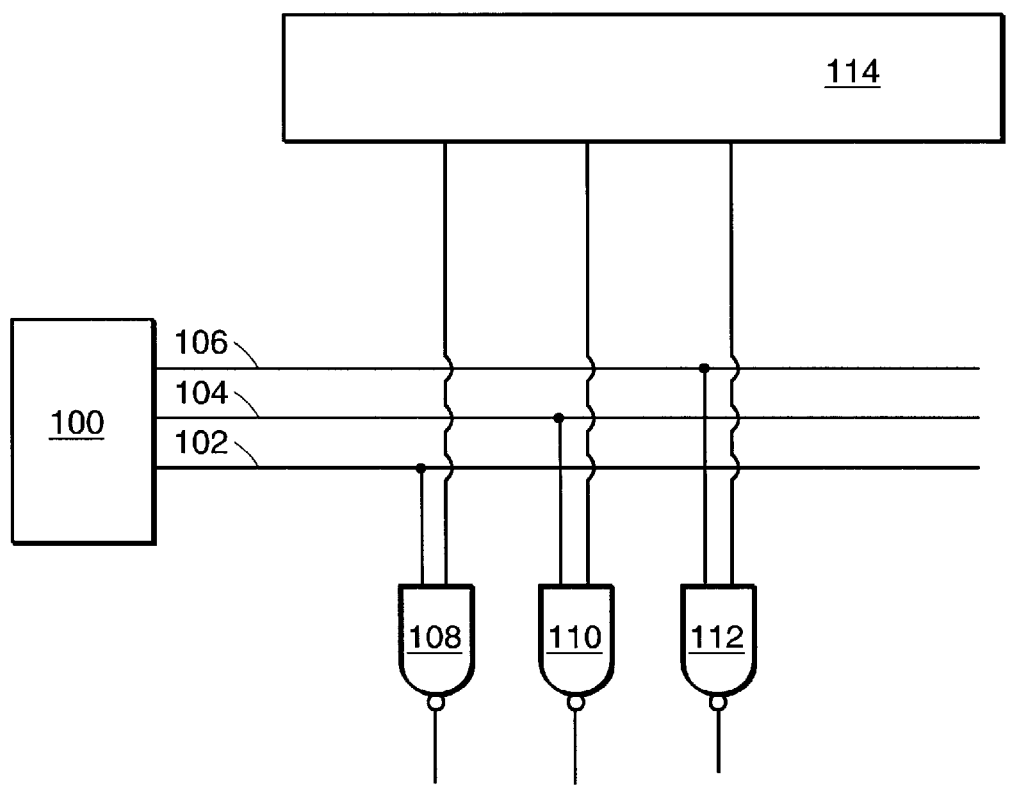
FIG. 3 is a schematic showing a built-in self test system in accordance with the invention.

Referring now to FIG. 3, the generation of the unique data patterns which are different from each other by at least two bit locations is shown. The circuit described also provides the complementary value for each of the unique data patterns, and the reverse of each of the unique data patterns. The generation of data patterns that differ by at least two bit locations is referred to as having a spacing of two, and is only possible if the number of distinct entries in the CAM, i.e., the number of words m, is less than the width of each word, i.e., the number of bits per word, n. This condition may be described mathematically as [n>log$_2$ (m)] and is found in most typical CAMs.

As an example of binary patterns that have a spacing of two, compare the six bit binary number 101010 with a second number 101001. The right hand bit, i.e., the "ones" column is different, and the "twos" column is also different, thus providing a spacing of two. A third number with a spacing of two from the two previous numbers is 100110, wherein the third number differs from the first number in the "fours" column (i.e., third place from the right) and the "eights" column (i.e., third place from the left), and from the second number in the one, twos, fours and eights columns.

The pattern generator 100 generates binary patterns having the same number of bits as the width of the words in the CAM, and having a spacing of two. Alternatively, pattern generator 100 may generate binary patterns with a width of one half of the word width and with a spacing of one, and then increase the spacing to two by reproducing the binary pattern twice, once for the first n/2 bits of the word and once for the last n/2 bits of the word in the CAM. For CAMs which have too many entries for the random generation method to work with the number of bits per word, the pattern generator may have selected starting bit patterns inserted. The pattern generator 100 has output data lines 102, 104 and 106 which feed NAND gates 108, 110 and 112, respectively. The outputs of NAND gates 108, 110, 112, are the write 62, 64, 66, or compare 68, 70, 72, inputs to the CAM cells 10 in the CAM array 50 of FIG. 2, and are used to write the three different unique data words into respective ones of the three illustrative word lines 54, 56 and 58 of FIG. 2. Shift register 114 is used to shift and hold the individual bits and to provide what is known as a walking inversion pattern, which is used in the invention to distinguish the location of the fault. The pattern generator 100 and shift register 114 provide the unique data patterns, the inversion of the unique patterns and the logical complement of the unique patterns.

Figure 4:
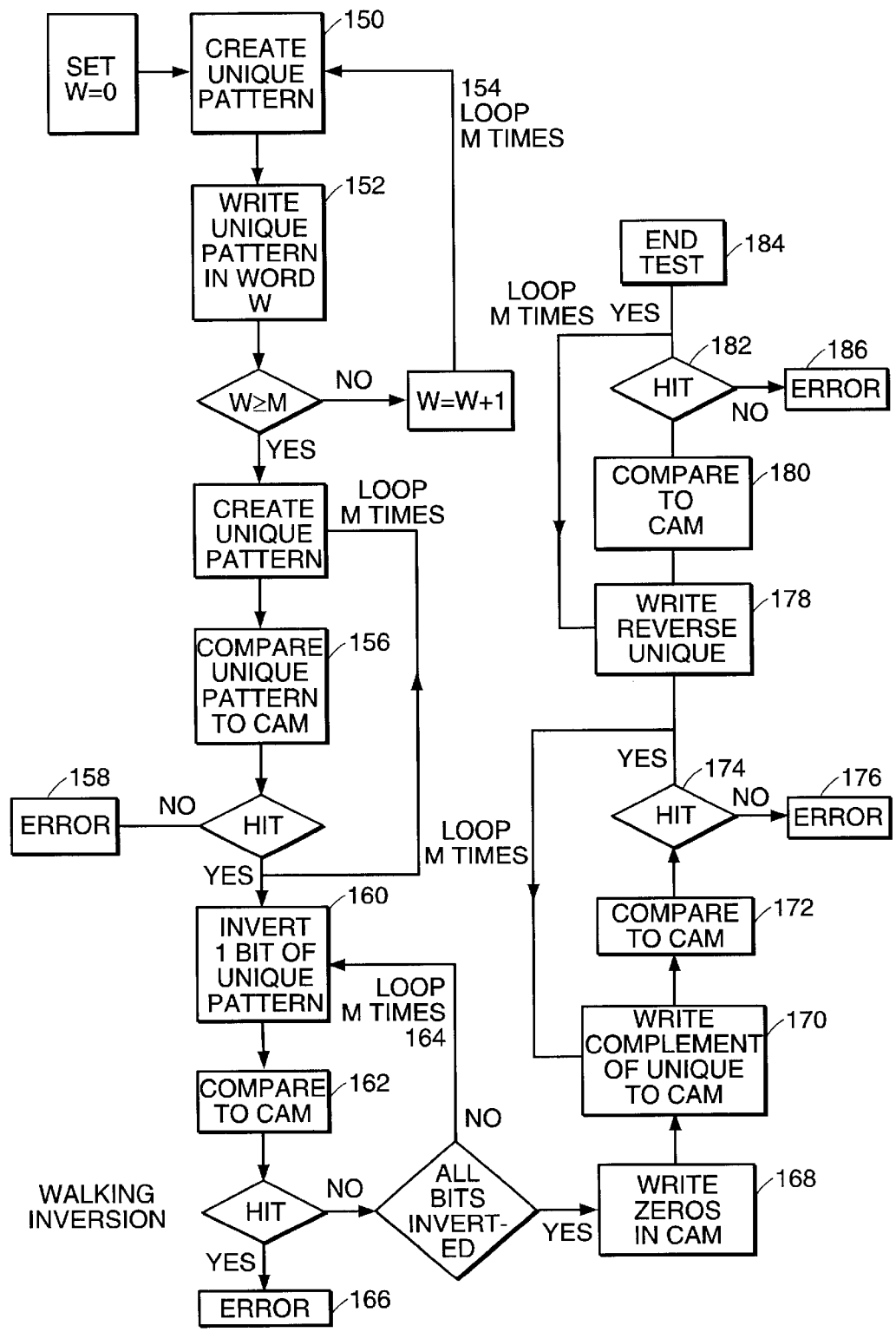
FIG. 4 is a flowchart showing the order of operations and loops of a testing system in accordance with the invention.

Referring now to FIG. 4, a flow chart shows the order of the steps of the testing of the CAM, 50. Note that none of the tests ever requires that a CAM cell 10, be read, only compared to an input. Thus the present invention does not require a read port be added to the CAM and thus reduces the overhead circuitry found in existing BIST systems for CAMs. Most embedded CAMs are not intended to have the contents read out like a standard memory such as a RAM, and thus do not typically provide read ports. Existing BIST systems require read ports, and thus CAMs using existing BIST systems must have normally useless added circuitry, with the concurrent increased cost and decreased device yields.

In general, the test operations shown in FIG. 4 consist of generating a unique data pattern 150 and writing the CAM 152, for each of the words in the CAM (loop 154). The patterns are different from each other by at least two bit locations. The unique patterns are then compared 156, one by one, to the contents of the CAM, and only one match should be found for each unique word. The match may occur on any one of the match lines 78, 80 or 82 from FIG. 2, and is detected by OR gate 84. If no match is found for any one of the unique patterns, then the CAM is faulty, 158. Next the unique patterns are inverted 160, and compared 162, to the CAM one bit at a time, (as represented by loop 164). No matches should be found or the array is faulty 166. This (loop 164, steps 160 and 162)is known as a walking inversion pattern.

The CAM is erased by writing zeros in all locations 168, and the whole cycle repeats rewriting the unique patterns in the CAM, but using the complement of the unique patterns 170 to write the CAM data. For simplicity and clarity, the loops for the complement testing are not shown, but are identical to the loops shown for the true uninverted data testing previously described at loop 156. The comparison of the complement 172 to the CAM data should again result in one hit per unique pattern 174, and the array is faulty if no match is found 176. This loop 170, 172, 174, 176, tests for patterns that erroneously gave positive results at step 158 due to what is known as a stuck at fault in one of the cells. The complement testing is repeated for all CAM words as was previously done for the true (i.e., uninverted) data patterns.

The process is again repeated by writing the data and the addresses in reverse at 178, and comparing the reverse data to the reverse data stored in the CAM at 180. Again the loops for doing each word in the CAM are not shown, but are identical to the loops performed for the true 156, and complement 170, 172, 174, 176, logic testing. Again there should be one hit or match per unique reverse data pattern at 182. If no match is found, there is a fault in the CAM indicated at step 186. This part of the test checks for missed error due to faults in the addressing logic. The overall test then ends at 184.

It is possible to test the function of the RAM that is typically associated with the CAM by performing the matching step 156 twice for each word, the first time while asserting the RAM write enable, and the second time by asserting the RAM read enable thus rewriting the unique data pattern into the CAM before the second compare test. Thus the RAM is simultaneously tested for the correct ability to write a data word and to read the same data word back into the CAM, all without any additional circuitry or silicon chip overhead.

The various faults may be identified by where the failure occurs in the test flow diagram for FIG. 4. Note again that none of the tests involves reading the data in the CAM array, simply whether or not a match was found. A storage cell which is stuck at zero or at one is found by the compare steps 156 and 172 in the true data and complement portions of the test. Adjacent cells in a single word being coupled are found in steps compare 156, 162, 172, in the true, walking inversion and complement test portions. Adjacent cells in different words being coupled are found in the writing zeros test 168 and by faults in the true and complement test at 156 and 172, plus in the reverse loop at step 180. Comparator inputs or output stuck at zero or at one are found in the true and complement loops and the walking inversion test. Address logic faults such as wrong word or multiple words selected are found in the reverse loop 180 and walking inversion test portions, 162. Faulty power, pull up or pull down transistors on the match lines may be found in all of the tests.

Thus, by the addition of the simple circuitry shown in FIG. 3, an embedded CAM that has fewer data entries than the number of bits in an individual entry, may be easily self tested with high fault coverage, and good identification of the fault mechanism and location. By the addition of a RAM read and a RAM write control lines and a repetition of the write unique pattern and compare unique pattern steps within the test, it is possible to self test an associated RAM memory simultaneously with the CAM test.

While this invention has been particularly shown and described with references to preferred embodiments thereof, it will be understood by those skilled in the art that various changes in forms and details may be made therein without departing from the spirit and scope of the invention as defined by the appended claims.

What is claimed is:

1. A method of built in self testing a content addressable memory, comprising the steps of:
   creating a set of unique binary data patterns, the number of the patterns being at least as large as the number of words contained in the content addressable memory;
   writing a different one of the unique patterns into each one of the word locations contained in the content addressable memory;
   comparing each one of the set of unique patterns with each word location in the content addressable memory;
   determining with a match indicator whether each one of the compared unique patterns matched the contents of any one of the words contained in the content addressable memory, and indicating an error if any one of the compared patterns indicates no match with any of the words.

2. The method of claim 1 wherein the set of unique binary data patterns each has at least two bit positions that differ in value from any other one of the data patterns.

3. The method of claim 2 wherein each one of the patterns of the set of unique binary patterns having at least two different bit locations are provided by attaching two copies of one of a second set of unique data patterns having at least one bit location different between members of the set, and having a bit length one half as long as the unique data patterns.

4. The method of claim 1 wherein the step of determining with a match indicator whether each one of the compared unique patterns matched the contents of any one of the words contained in the content addressable memory, and indicating an error if any one of the compared patterns indicates no match with any of the words further employs an OR gate having as inputs the match lines of each one of the words in the content addressable memory.

5. The method of claim 1 further comprising:
   testing an attached random access memory along with testing the content addressable memory, by performing the comparing step twice, first with a write enable signal of the random access memory asserted to copy the content addressable memory data to the attached random access memory; and
   asserting a read enable signal of the random access memory to rewrite the data into the content addressable memory and repeating the comparing step.

6. The method of claim 1 wherein the content addressable memory is part of a system to test embedded random access memories.

7. The method of claim 1, further comprising:
   inverting a first bit of the unique patterns and repeating the comparing and determining steps; and
   indicating an error if any one of the compared patterns does indicate a match with any of the words.

8. The method of claim 1, further comprising:
   repeating the inverting step with each individual one of the bits of the unique patterns until all bits in each unique pattern have been inverted and compared to the contents of the content addressable memory.

9. The method of claim 1, further comprising:
   creating the logical complement of each unique pattern and repeating all previous steps after the writing step using the complement patterns.

10. The method of claim 1, further comprising:
    creating the reverse of each unique pattern and repeating all previous steps after the writing step using the reverse patterns.

11. Apparatus for testing a content addressable memory, comprising:
    a pattern generator for creating a set of unique binary data patterns, the number of the patterns being at least as large as the number of words contained in the content addressable memory, the pattern generator writing a different one of the unique patterns into each one of the word locations contained in the content addressable memory; and
    comparison means responsive to the pattern generator for comparing each one of the set of unique patterns with each word location in the content addressable memory, and for determining whether each one of the compared unique patterns matched the contents of any one of the words contained in the content addressable memory.

12. Apparatus as claimed in claim 11, further comprising a walking inversion logic circuit for inverting a first bit of the unique patterns and repeating the comparing and determining by the comparison means.

13. Apparatus as claimed in claim 12, wherein the walking inversion logic further repeats the inverting such that each individual one of the bits of the unique patterns is inverted one at a time until all bits in each unique pattern have been inverted and compared to the contents of the content addressable memory.

14. Apparatus as claimed in claim 13, further comprising:
    means for creating the logical complement of each unique pattern, the pattern generator being responsive to the logical compliment patterns by writing different ones of said patterns to each one of the CAM word locations; and
    the comparison means further compares and determines using the complement patterns.

15. Apparatus as claimed in claim 14, the pattern generator comprising;
    means for creating the reverse of each unique pattern;
    the pattern generator writing a different one of the reversed unique patterns into each one of the word locations contained in the content addressable memory; and
    the comparison means further comparing and determining using the reverse patterns.

16. The apparatus of claim 15 further comprising an attached random access memory which is tested along with the content addressable memory, the comparison means further comparing the unique patterns twice, first with a write enable signal of the random access memory asserted to copy the content addressable memory data to the attached random access memory, then second asserting a read enable signal of the random access memory to rewrite the data into the content addressable memory and repeating the comparing.

17. The apparatus of claim 15 wherein the comparison means further comprises an OR logic gate whose inputs comprise the match outputs of each of the words in the content addressable memory.

18. The apparatus of claim 15 wherein the content addressable memory is an embedded memory in an electronic device.

19. The apparatus of claim 18 wherein the apparatus for testing the content addressable memory is part of the electronic device in which the content addressable memory is embedded.

20. An apparatus for built in self testing of embedded memory, comprising:
    a unique binary bit pattern generator connected to data inputs and compare inputs of an array of content addressable memory cells;

a shift register connected to the pattern generator and the inputs of the array for shifting and reversing the order of the unique data patterns;

a random access memory having at least one word storage location attached to each row of the array of content addressable memory cells, for storing and writing the unique binary bit patterns;

a logic gate attached to all of the individual rows of the content addressable memory, for determining if a compare input matches the unique binary data pattern in any one of the rows of the array of content addressable memory; and a working output device including:
 (i) a memory to store, and
 (ii) an output device to indicate, when a unique data pattern matched one of the unique data patterns stored in the content addressable memory.

* * * * *